(12) United States Patent
Miura

(10) Patent No.: US 8,574,369 B2
(45) Date of Patent: *Nov. 5, 2013

(54) METHOD OF REMOVING RESIST AND APPARATUS THEREFOR

(75) Inventor: Toshinori Miura, Yaizu (JP)

(73) Assignee: Meidensha Corporation, Tokyo (JP)

( * ) Notice: Subject to any disclaimer, the term of this patent is extended or adjusted under 35 U.S.C. 154(b) by 493 days.

This patent is subject to a terminal disclaimer.

(21) Appl. No.: 12/743,275

(22) PCT Filed: Nov. 20, 2008

(86) PCT No.: PCT/JP2008/071085
§ 371 (c)(1),
(2), (4) Date: May 17, 2010

(87) PCT Pub. No.: WO2009/072402
PCT Pub. Date: Jun. 11, 2009

(65) Prior Publication Data
US 2010/0300482 A1    Dec. 2, 2010

(30) Foreign Application Priority Data

Dec. 4, 2007   (JP) ................. 2007-314078

(51) Int. Cl.
*C25F 1/00* (2006.01)
(52) U.S. Cl.
USPC ........ 134/1.3; 134/1.1; 134/1.2; 134/31; 15/1; 216/58; 438/706; 438/725
(58) Field of Classification Search
None
See application file for complete search history.

(56) References Cited

U.S. PATENT DOCUMENTS

| | | |
|---|---|---|
| 6,231,676 B1 | 5/2001 | Rudd et al. |
| 6,551,409 B1 | 4/2003 | DeGendt et al. |
| 6,616,773 B1 | 9/2003 | Kuzumoto et al. |
| 6,634,368 B1 | 10/2003 | Jung et al. |
| 6,696,228 B2 | 2/2004 | Muraoka et al. |

(Continued)

FOREIGN PATENT DOCUMENTS

| | | |
|---|---|---|
| CN | 1659481 A | 8/2005 |
| JP | 64-081318 A | 3/1989 |

(Continued)

OTHER PUBLICATIONS

Toshinori Miura,, USPTO Office Action, U.S. Appl. No. 12/598,501, filed Sep. 1, 2010, 5 pages.

(Continued)

*Primary Examiner* — Eric Golightly
(74) *Attorney, Agent, or Firm* — Foley & Lardner LLP

(57) ABSTRACT

A method for removing a resist on a substrate includes supplying unsaturated hydrocarbon gas or fluorine substitution product gas of unsaturated hydrocarbon, at a lower pressure than an atmospheric pressure, to a system of reaction capable of heating the substrate and supplying ozone gas at a lower pressure than the atmospheric pressure to the system of reaction. The ozone gas is an ultra-high concentration ozone gas obtained by separating only ozone from ozone-containing gas by a difference of vapor pressure through liquefaction separation and by vaporizing a liquefaction-separated ozone again. The substrate may be cleaned with pure water. A susceptor that holds the substrate is provided in a chamber of the system of reaction and is heated by a light source that emits infrared light. An internal pressure of the chamber is controlled so that a temperature of the substrate is 90° C. or less.

7 Claims, 8 Drawing Sheets

(56) References Cited

U.S. PATENT DOCUMENTS

| | | | |
|---|---|---|---|
| 6,955,178 B1 | 10/2005 | Kuzumoto et al. | |
| 8,187,389 B2 * | 5/2012 | Miura | 134/30 |
| 2001/0027023 A1 | 10/2001 | Ishihara | |
| 2002/0011257 A1 | 1/2002 | DeGendt et al. | |
| 2002/0088478 A1 | 7/2002 | DeGendt et al. | |
| 2003/0108823 A1 | 6/2003 | Muraoka et al. | |
| 2004/0076912 A1 | 4/2004 | Muraoka et al. | |
| 2004/0106222 A1 * | 6/2004 | Steckl et al. | 438/22 |
| 2004/0221877 A1 | 11/2004 | Bergman | |
| 2006/0137723 A1 | 6/2006 | Bergman | |
| 2007/0054492 A1 | 3/2007 | Elliott et al. | |
| 2007/0077769 A1 | 4/2007 | DeGendt et al. | |
| 2007/0107751 A1 | 5/2007 | Tokuno et al. | |
| 2007/0254489 A1 | 11/2007 | Kawaguchi et al. | |
| 2007/0272359 A1 | 11/2007 | Kawaguchi et al. | |
| 2008/0099040 A1 | 5/2008 | Bahng et al. | |
| 2008/0102646 A1 | 5/2008 | Kawaguchi et al. | |
| 2010/0139708 A1 | 6/2010 | Mirura | |

FOREIGN PATENT DOCUMENTS

| | | | |
|---|---|---|---|
| JP | 4-150013 A | 5/1992 | |
| JP | 5-074742 A | 3/1993 | |
| JP | 8-069896 A | 3/1996 | |
| JP | 8-139004 A | 5/1996 | |
| JP | 9-027473 A | 1/1997 | |
| JP | 11-219926 A | 8/1999 | |
| JP | 2001-223206 A | 8/2001 | |
| JP | 2001-304756 A | 10/2001 | |
| JP | 2001-308078 A | 11/2001 | |
| JP | 2003-020209 A | 1/2003 | |
| JP | 2003-188137 A | 7/2003 | |
| JP | 2003-273059 A | 9/2003 | |
| JP | 2003-330206 A | 11/2003 | |
| JP | 2006-156919 A | 6/2006 | |
| JP | 2006-294842 A | 10/2006 | |
| WO | WO 03/104900 A2 | 12/2003 | |

OTHER PUBLICATIONS

Toshinori Miura, USPTO Office Action, U.S. Appl. No. 12/598,501, filed Oct. 13, 2010, 10 pages.

Toshinori Miura, USPTO Office Action, U.S. Appl. No. 12/598,501, filed Sep. 30, 2011, 10 pages.

Toshinori Miura, USPTO Office Action, U.S. Appl. No. 12/598,501, filed Apr. 5, 2011, 12 pages.

* cited by examiner

PMMA poly(methyl methacrylate)
poly[1-(methoxycarbonyl)-1-methylethylene]
ArF RESIST BASE POLYMER poly[1-(4-hydroxyphenyl)ethylene]
poly(4 or p-vinylphenol)
poly(p-hydroxystyrene)
KrF RESIST BASE POLYMER Novolak RESIN
G LINE, I LINE RESIST BASE POLYMER

METHOD OF REMOVING RESIST AND APPARATUS THEREFOR

TECHNICAL FIELD

The present invention relates to a technique for removing a resist, particularly a high-dose ion implantation resist, formed on a substrate in a manufacturing process of a semiconductor device.

BACKGROUND ART

As the technique for removing the high-dose ion implantation resist on the substrate, for example, they have been disclosed in the following Patent Documents.

In Patent Document 1, a method for plasma processing and its apparatus have a substrate bias application means and a substrate heat application means, and the plasma processing is performed to the substrate using a helicon wave plasma processing. More specifically, a resist mask on the substrate is removed by an ion mode-dominated plasma processing that utilizes a high ion current by the helicon wave plasma and a radical mode-dominated plasma processing by a non-resonant inductively coupled plasma.

In Patent Document 2, a method for plasma processing and its apparatus have a transparent bell jar made of dielectric material that allows UV rays to pass through, and ashing of a hardening affected layer of a resist mask on a substrate is performed by the plasma processing apparatus. Further, by application of the UV rays in an ozone atmosphere, asking of an unaffected layer of the resist mask on the substrate is performed.

In Patent Document 3, a resist removal method and its apparatus heat a substrate and intentionally induce a popping phenomenon in a resist on a surface of a substrate. The resist is then peeled off by an adhesive tape after cooling the substrate. Subsequently, ashing is performed with oxygen plasma, ozone (see Patent Document 4) or a combination between UV and ozone.

Regarding the high-dose ion implantation resist, a filmy hardened layer is formed on the surface of the substrate. Since a lower layer of this resist is a soft resist (the unaffected layer), when heating the substrate, e.g. when heating the substrate up to a high temperature more than 200° C., the so-called popping phenomenon, in which the surface cracks due to outgassing from the unaffected layer of the lower layer and/or thermal expansion difference then blows off, occurs. The popping phenomenon pollutes not only the substrate but also an inside of a chamber in which the substrate is set with the blowing-off hardened layer of the substrate surface.

Therefore, the resist removal method including such heating process as described in Patent Document 3 reduces the yield of the device which can be obtained from the substrate. Furthermore, a maintenance cycle of the manufacturing apparatus must be shortened, and these affect a throughput of the substrate.

On the other hand, in such processing method as described in Patent Document 1, Patent Document 2 and Patent Document 4, although the popping phenomenon can be suppressed, a plasma generator is required for the apparatus and the method. The plasma generator is expensive. In addition, if this plasma generator is added, system of the apparatus for removing the resist becomes great. Moreover, an energy cost for resist removal rises.

Patent Document 1: Japanese Patent Application Publication No. JP8-69896 (paragraphs [0010]~[0016])

Patent Document 2: Japanese Patent Application Publication No. JP8-139004 (paragraphs [0011]~[0023])

Patent Document 3: Japanese Patent Application Publication No. JP9-27473 (paragraphs [0008]~[0011])

Patent Document 4: Japanese Patent Application Publication No. JP2006-294842 (paragraphs [0016], [0026])

DISCLOSURE OF THE INVENTION

In order to solve the above problem, in a resist removal method, unsaturated hydrocarbon gas or fluorine substitution product gas of unsaturated hydrocarbon together with ozone gas are supplied to a system of reaction, where heating of a substrate is possible, at a lower pressure than an atmospheric pressure, and a resist on the substrate is removed.

Further, in order to solve the above problem, a resist removal apparatus has a chamber which holds a substrate coated with a resist that is going to be removed and can heat the substrate; a means for supplying ozone gas into the chamber at a lower pressure than an atmospheric pressure; and a means for supplying unsaturated hydrocarbon gas or fluorine substitution product gas of unsaturated hydrocarbon into the chamber at the lower pressure than the atmospheric pressure.

According to the above resist removal method and its apparatus, the resist removal of the substrate can be achieved at 90° C. or less. Therefore, even the process of the high-dose ion implantation resist, the occurrence of the popping phenomenon can be prevented. In addition, since the resist on the substrate is removed in a reduced pressure state which is the lower pressure than the atmospheric pressure, even if high concentration of ozone gas that might entail danger is used, safety is ensured. Furthermore, damage to the lower layer of the substrate is reduced. Especially in the case of the high-dose ion implantation resist, the resist removal can be achieved while surely preventing the popping phenomenon. Moreover, even when a substance (e.g. Cu line) that is subject to oxidation exists beneath the resist, it is possible to keep this oxidation to a minimum.

As the unsaturated hydrocarbon gas, hydrocarbon (alkene) having a double bond of carbon which is exemplified by ethylene, or hydrocarbon (alkyne) having a triple bond of carbon which is exemplified by acetylene, is given, and also hydrocarbon of low molecular weight such as butylene is given. As the fluorine substitution product gas of unsaturated hydrocarbon, fluorine substitution product gas of each of the above hydrocarbons is given.

In the resist removal method, as the ozone gas, it is preferable to use ultra-high concentration ozone gas that is obtained by separating only ozone from ozone-containing gas by a difference of vapor pressure through liquefaction separation and by vaporizing the above ozone again. In the resist removal apparatus, for the supply of the ozone gas, it is preferable to provide an ozone generator that produces ultra-high concentration ozone gas by separating only ozone from ozone-containing gas by a difference of vapor pressure through liquefaction separation and by vaporizing the above ozone again. By using the ultra-high concentration ozone gas, oxidation removal of the resist can efficiently be achieved. The ozone gas is not limited to the ultra-high concentration ozone gas.

In the resist removal method and the resist removal apparatus, as a heating means of the substrate, an example in which the substrate is held on a susceptor and this susceptor is heated, is given. For instance, an example in which the substrate is heated by radiating infrared light to this susceptor, is given. Here, a heating means of the susceptor is not limited to the light source. It could be a heater or various heating means such as induction heating. Or various heating means such as the heater might be installed in the susceptor.

Further, in the resist removal method and the resist removal apparatus, in a case where the substrate has an ion-implanted resist, it is preferable to clean the substrate which is treated with unsaturated hydrocarbon gas or fluorine substitution product gas of unsaturated hydrocarbon together with ozone gas, with ultrapure water. Since the ion, which is implanted in the semiconductor manufacturing process, forms a low vapor pressure compound by oxidation reaction in most cases, even after the resist is completely removed, this remains on the substrate surface and becomes a residue. Because this forms a water soluble compound, this compound dissolves in the ultrapure water and can be removed.

Moreover, in the resist removal method and the resist removal apparatus, upon the removal of the resist on the substrate, when controlling internal pressures of the system of reaction and the chamber so that a temperature of the substrate is 90° C. or less, the popping phenomenon can surely be prevented.

According to the above invention, since the resist removal can be achieved at the low temperature of 90° C. or less, metal of the lower layer of the substrate is not oxidized. In particular, the high-dose ion implantation resist can be removed while preventing the occurrence of the popping phenomenon. In addition, the reduction of the energy cost for resist removal and simplification of the system can be realized.

BEST MODE FOR CARRYING OUT THE INVENTION

Figure 1A:
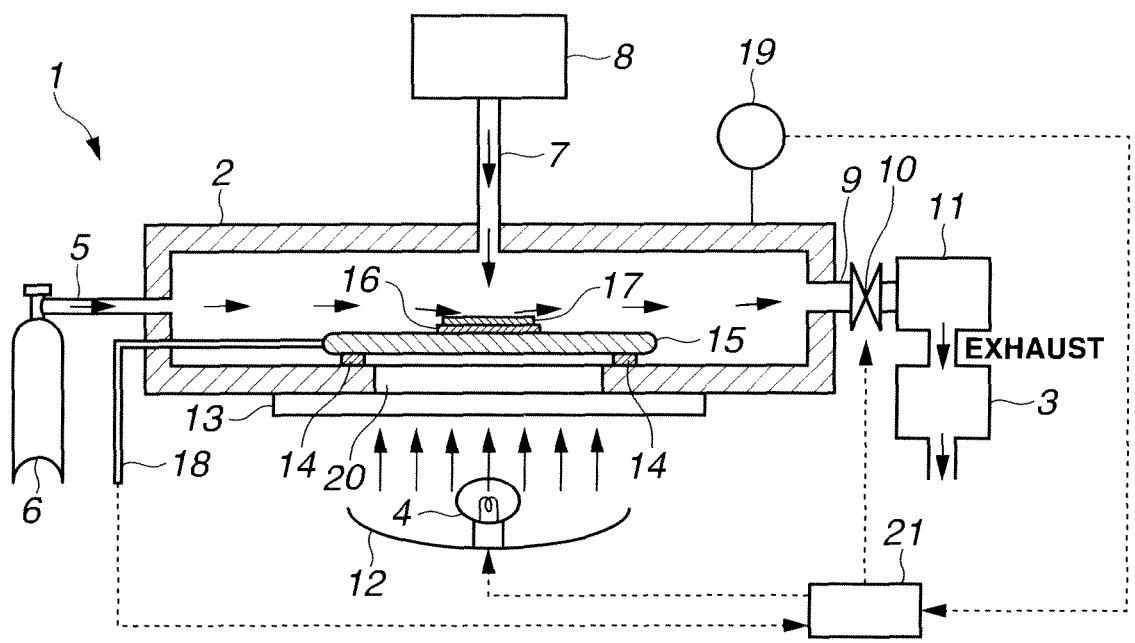
FIG. 1A is a sectional view schematically showing a system of a resist removal apparatus according to an embodiment of the present invention.
Figure 1B:
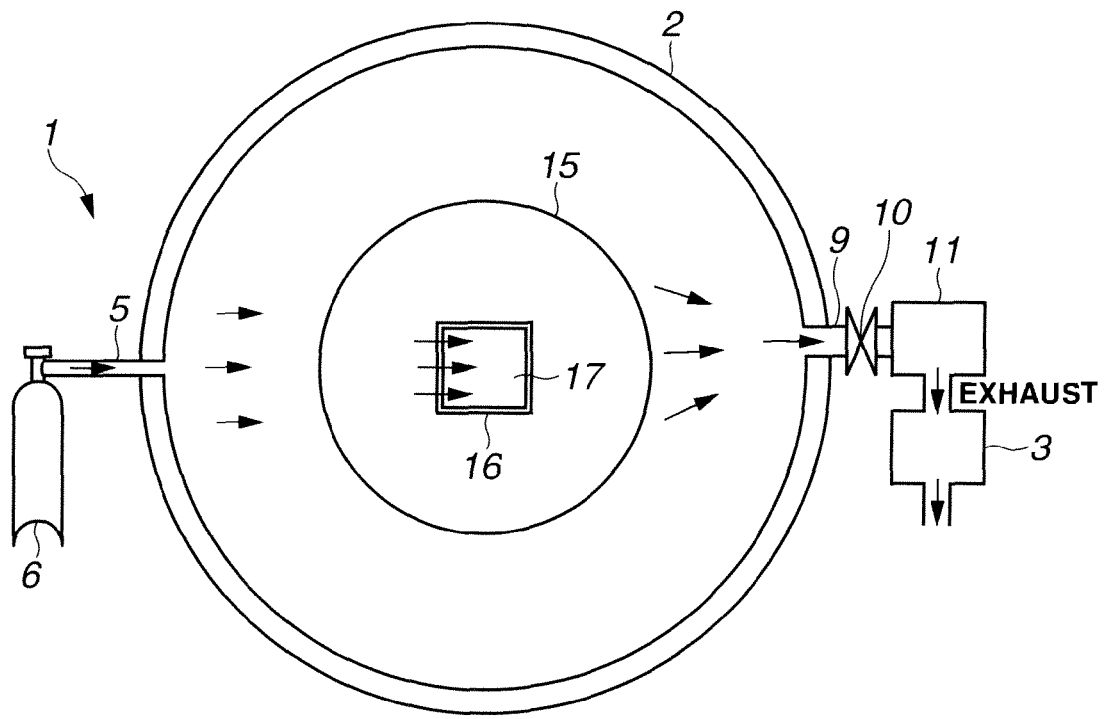
FIG. 1B is a plan view schematically showing the resist removal apparatus.

FIG. 1A is a sectional view schematically showing a system of a resist removal apparatus 1 according to an embodiment of the present invention. FIG. 1B is a plan view schematically showing the resist removal apparatus 1.

Figure 7:
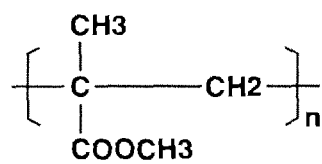
FIG. 7 shows molecular structures of various resists.
Figure 7:
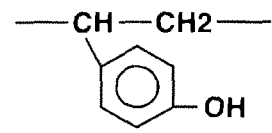
Figure 7:
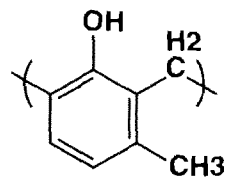

The resist removal apparatus 1 has a chamber 2, a vacuum pump 3 and a light source 4. The chamber 2 holds a substrate 16 coated with a resist 17 which is going to be removed, and ozone gas ($O_3$) and unsaturated hydrocarbon gas are introduced into the chamber 2. As the resist 17, such a resist for ArF (ArF resist), a resist for KrF (KrF resist) and resists for G, I lines (G-line resist, I-line resist) as shown in FIG. 7 are given.

As can be seen in FIGS. 1A and 1B, the chamber 2 is formed into a cylindrical shape. The chamber 2 is supplied with the unsaturated hydrocarbon gas or fluorine substitution product gas of the unsaturated hydrocarbon from a side face portion, also is supplied with the ozone gas from a ceiling portion. The chamber 2 is designed so that the gases introduced into the chamber 2 are drawn and exhausted from a side face portion opposite to the above side face portion by the vacuum pump 3.

As the unsaturated hydrocarbon gas, hydrocarbon (alkene) having a double bond of carbon which is exemplified by ethylene, or hydrocarbon (alkyne) having a triple bond which is exemplified by acetylene, is given. As the fluorine substitution product gas, fluorine substitution product gas of each of the above hydrocarbons is given. For example, it is tetrafluoroethylene. The unsaturated hydrocarbon gas or the fluorine substitution product gas is introduced into the chamber 2 from a gas cylinder 6, which is a gas supply means of each of these gases, through a pipe 5. The fluorine substitution product gas such as tetrafluoroethylene particularly further enhances an effect of the removal of the hardened ion implantation resist. Thus the fluorine substitution product gas such as tetrafluoroethylene is effective in the resist removal.

As the ozone gas, ultra-high concentration ozone gas is used. This ozone gas is introduced into the chamber 2 from an ozone generator 8, which is an ozone supply means, through a pipe 7. The pipe 7 is connected to a center portion of a lid that seals the chamber 2. This lid seals the chamber 2 via an ancillary sealing member. As the ancillary sealing member, for instance, an O-ring made of an ozone-resistant material such as silicon rubber, is employed.

Regarding the ultra-high concentration ozone gas, for example, only ozone in ozone-containing gas is separated by a difference of vapor pressure through liquefaction separation, then by vaporizing this ozone again, the ultra-high concentration ozone gas can be obtained. More specifically, ozone gas obtained by an ozone generator disclosed in Patent Document JP2001-304756 or JP2003-20209, is given. The ozone generators separate only ozone by the difference of vapor pressure between the ozone and other gas components (e.g. oxygen) through the liquefaction separation, then produce the ozone gas of the ultra-high concentration (ozone concentration≈100%). In particular, the ozone generator of JP2003-20209 has a plurality chambers for liquefying and vaporizing only ozone, and is configured to be able to seamlessly supply the ultra-high concentration ozone gas by executing temperature control of these chambers individually. As a commercial ozone generator based on this ultra-high concentration ozone gas seamless supply system, for instance, a pure ozone generator (MPOG-HM1A1) made by MEIDENSHA is given.

The ozone gas is not limited to the ultra-high concentration ozone gas. For example, it could be ozone gas whose ozone concentration is several tens of percent or more. This ozone gas might entail danger because of high reactivity under atmospheric pressure. However, in the resist removal apparatus 1, since the inside of the chamber 2 is in a reduced pressure state by the vacuum pump 3, it is possible to treat the ozone gas safely. Under the atmospheric pressure, ozone concentration 14.3~38 vol % is a persistent decomposition region, ozone concentration ~44 vol % is a sudden region, and ozone concentration 44 vol %~ is a detonation region (Hidetoshi SUGIMITSU, basis and application of ozone, KORINSHA, 1996, pp. 187).

Figure 8:
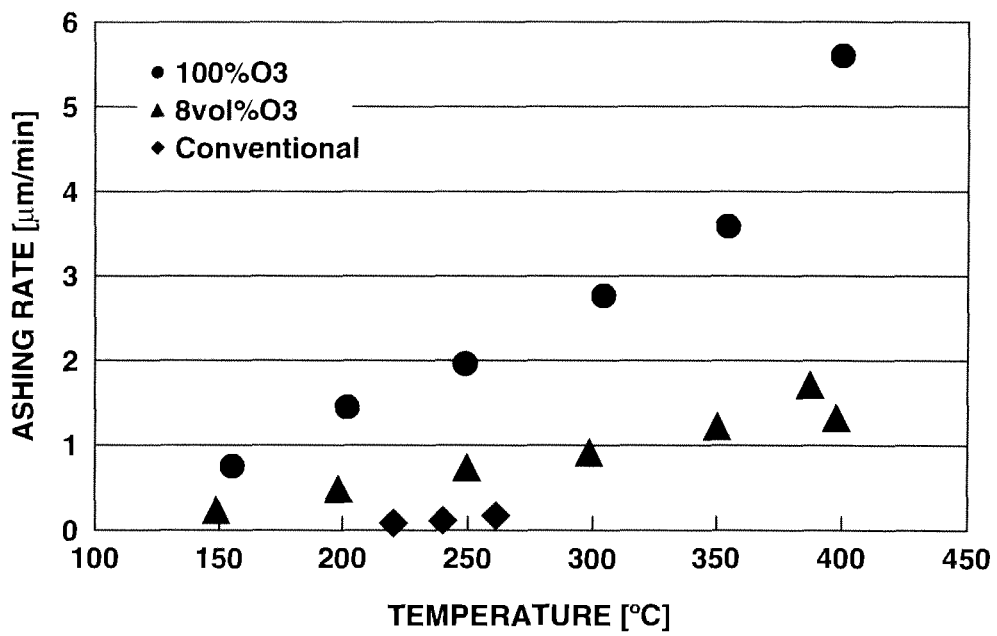
FIG. 8 is a plot showing a relationship between a substrate temperature [° C.] and an ashing rate [μm/min] when performing an ashing process of the Si substrate with only various ozone gases (ultra-high concentration ozone gas (ozone concentration≈100 vol %), ozone gas of ozone concentration 8 vol %, and ozone gas of "Conventional").
Figure 9:
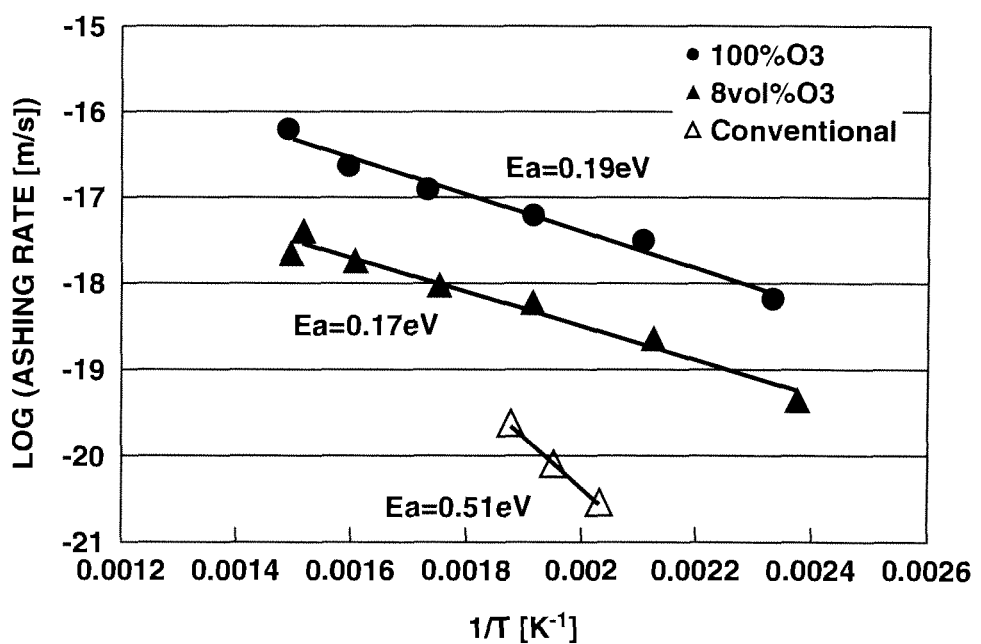
FIG. 9 is an Arrhenius plot when performing the ashing process of the Si substrate with only various ozone gases (ultra-high concentration ozone gas (ozone concentration≈100 vol %), ozone gas of ozone concentration 8 vol %, and ozone gas of "Conventional").

FIG. 8 is a plot showing a relationship between a substrate temperature [° C.] and an ashing rate [µm/min] when performing an ashing process of the Si substrate with only various ozone gases (ultra-high concentration ozone gas (ozone concentration≈100 vol %), ozone gas of ozone concentration 8 vol %, and ozone gas of "Conventional"). FIG. 9 is an Arrhenius plot when performing the ashing process of the Si substrate with only various ozone gases (ultra-high concentration ozone gas (ozone concentration≈100 vol %), ozone gas of ozone concentration 8 vol %, and ozone gas of "Conventional"). The ultra-high concentration ozone gas is the gas that is produced by the ozone generator (MPOG-HM1A1) made by MEIDENSHA. "Conventional" represents a case where the ashing process is performed by a resist removal apparatus (UV DRY STRIPPER/CLEANER MODEL UV-300H made by SAMCO, Inc.) using an existing ozone. In this resist removal apparatus of "Conventional", UV light is radiated while flowing low concentration ozone gas (ozone concentration≈2 vol %) under the atmospheric pressure. As is clear from these plots, the ashing rate (efficiency of the resist removal) by using the ultra-high concentration ozone gas can be identified as a remarkably high rate. Further, it was found that, although the removal of the high-dose ion implantation resist was possible in a process using the ultra-high concentration ozone gas at 400° C. (as exemplified in FIG. 4), because of high temperature, the popping occurred during rise of temperature (as exemplified in FIG. 3), and a resist surface hardened layer, which was going to be fine particles, was adhered to the inside of the chamber.

The vacuum pump 3 draws and exhausts the gas in the chamber 2 in the reduced pressure state. A pipe 9 connecting the chamber 2 and the vacuum pump 3 is provided with an exhaust valve 10 and an ozone killer 11. Regarding the exhaust valve 10, its opening can be controlled by a control section 21. The exhaust valve 10 regulates a gas flow inside the chamber 2 to set an internal pressure of the chamber 2 to a predetermined value. Thus, the chamber 2 is provided with a pressure gauge 19 for gauging the internal pressure. As the vacuum pump 3, it is preferable to employ a dry pump that is resistant to ozone, in order to prevent decrease in lifetime caused by performance degradation and deterioration due to some ozone gas that might exist in exhaust gas. The ozone killer 11 decomposes ozone that exists in the gas drawn out of the chamber 2. As the ozone killer 11, an existing ozone decomposition system which has been employed in semiconductor manufacturing technology could be employed.

As shown in FIG. 1A, a susceptor 15 is installed through a supporting member 14 at a bottom section inside the chamber 2. As shown in FIG. 1B, the substrate 16 coated with the resist 17 which is going to be removed is put at a center on the susceptor 15. The susceptor 15 is made of SiC, and is formed into an almost disc shape. The susceptor 15 is arranged concentrically with the bottom section of the chamber 2. The susceptor 15 is connected to a thermocouple 18. The thermocouple 18 converts heat (temperature) of the susceptor 15, which is detected to control a temperature of the susceptor 15, to an electric signal, then supplies it to the control section 21. The control section 21 supplies a control signal of light intensity of the light source 4 based on the electric signal to the light source 4.

The light source 4 heats the substrate 16 by heating the susceptor 15 inside the chamber 2. The light source 4 is set under the chamber 2. As the light source 4, a light source that emits infrared rays, which has been employed as a heating means in semiconductor manufacturing technology, could be employed. The light intensity of the light source 4 can be controlled by the control section 21. The light source 4 is provided with a reflector 12 to condense radiated light, as necessary. In addition, at the bottom section of the chamber 2, an opening section 20 for introducing the infrared light emitted from the light source 4 is formed. And a light introduction window 13 is provided so as to cover this opening section 20. The light introduction window 13 is made of material such as artificial quartz, which allows the infrared light to pass through.

An example of operation of the resist removal apparatus 1 will be explained with reference to FIGS. 1A, 1B and 2. Under a condition in which the exhaust valve 10 is set to be fully open, by a suction force of the vacuum pump 3, the unsaturated hydrocarbon, e.g. the ethylene gas, is supplied in the chamber 2 from the gas cylinder 6, and also the ultra-high concentration ozone gas (ozone concentration≈100%) is supplied in the chamber 2 from the ozone generator 8. The substrate 16 is kept at 80° C. or less through the susceptor 15 heated by the light source 4. Next, the opening of the exhaust valve 10 is controlled so that the internal pressure (a measured value of the pressure gauge 19) of the chamber 2 becomes, for example, 400 Pa. The process is performed for five minutes in this state. In a case of this time period of the process, although the temperature of the substrate 16 on the susceptor 15 rises by self-heating, it is controlled at 90° C. or less. Afterwards, the supply of the ultra-high concentration ozone gas and the ethylene gas is stopped. In a reaction process in the chamber 2, the resist 17 is decomposed by various radicals such as hydrogen radical which are generated by the unsaturated hydrocarbon and the ozone introduced in the chamber (The Chemical Society of Japan, *seasonal publication chemistry sousetsu*, No. 7, Chemistry of Active Oxigen Species, published Apr. 20, 1990, pp. 36~37). In such process, components of the resist 17, which are made of hydrocarbon, on the substrate 16 are decomposed into carbonic acid gas and water. The carbonic acid gas and the water are exhausted from the chamber 2 through the pipe 9.

Figure 2:
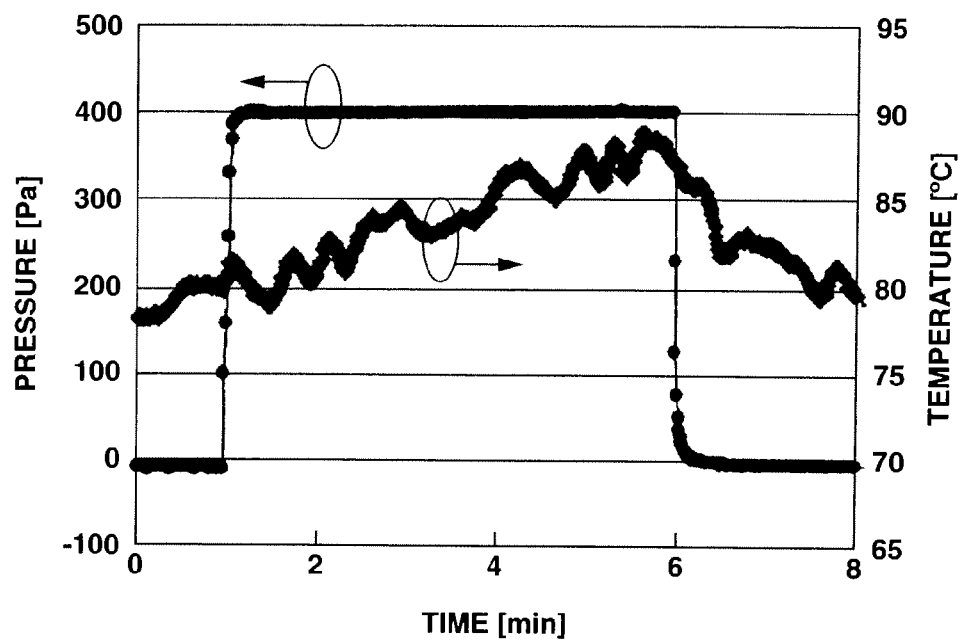
FIG. 2 shows variations of a susceptor temperature and a chamber pressure with time in the resist removal apparatus according to the embodiment of the present invention.

FIG. 2 shows an example of variations of the susceptor temperature and the chamber pressure with time, by the above example of the operation. It was found that, before introduction of the ultra-high concentration ozone gas from the ozone generator 8 (ozone generator MPOG-HM1A1), the temperature of the susceptor 15 was stable at about 80° C., and although the temperature rose by the heat of reaction after introducing the ozone gas, the process was completed at less than 90° C.

Figure 10:
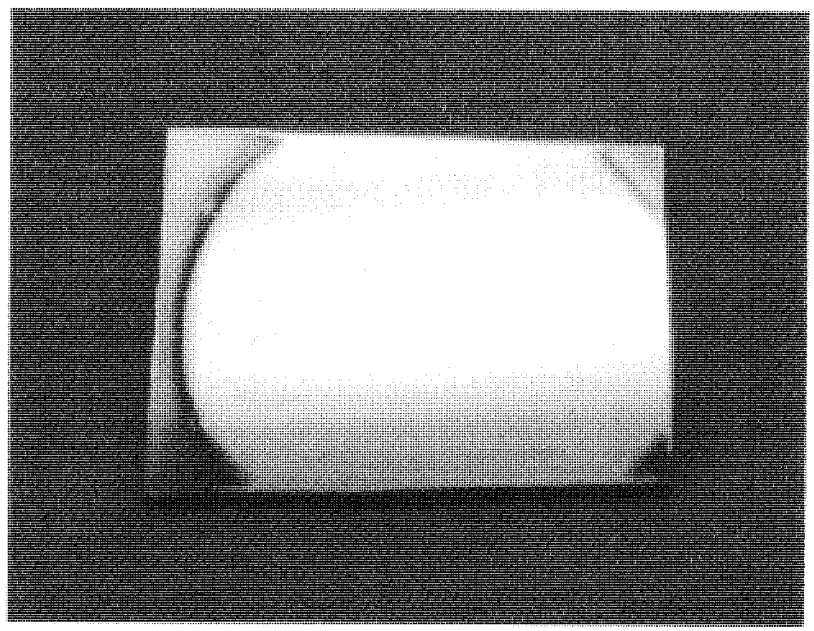
FIG. 10 is a photograph of appearance of a substrate surface which is treated by the resist removal method according to the embodiment of the present invention.
Figure 11:
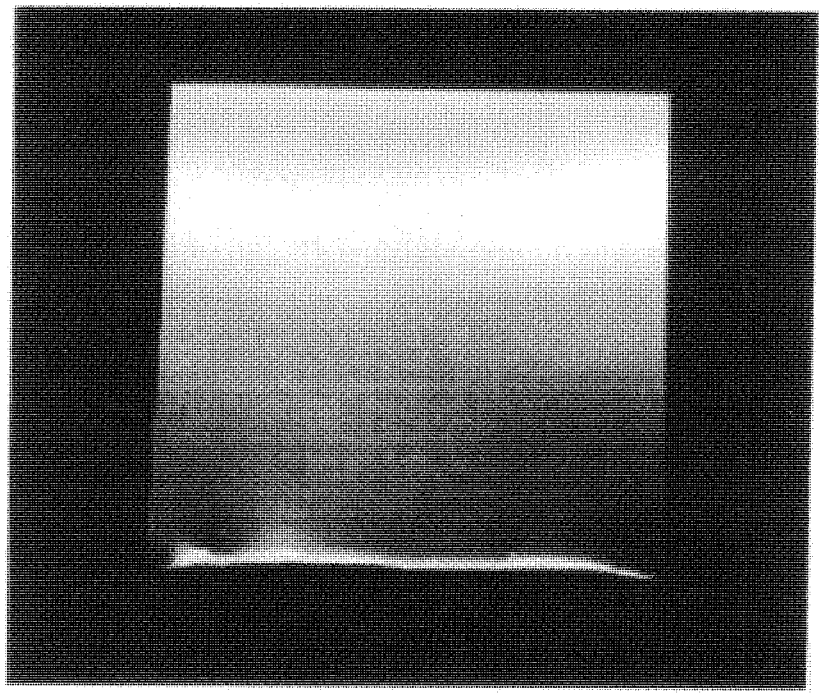
FIG. 11 is a photograph of appearance of a surface of a copper plate which is treated by the resist removal method according to the embodiment of the present invention.

FIG. 10 is a photograph of appearance of a substrate surface which is treated by the resist removal apparatus 1 according to the embodiment. More specifically, it is a photograph of appearance of surface of a Si substrate (30 mm×30 mm) coated with KrF resist into which P (phosphorus) of 5E15/cm$^2$ (5×10$^{15}$/cm$^2$) is implanted, which is treated on the basis of a time chart shown in FIG. 2. No popping phenomenon occurred when a maximum temperature of the susceptor 15 was about 90° C. It can be found that influence of the process at such low temperature upon a lower layer (Si substrate) is extremely small. In addition, as shown in FIG. 11, when treating a copper plate (40 mm×40 mm), which is very subject to oxidation, on the same condition as the embodiment of FIG. 10, no discoloration appeared on its appearance.

Figure 12:
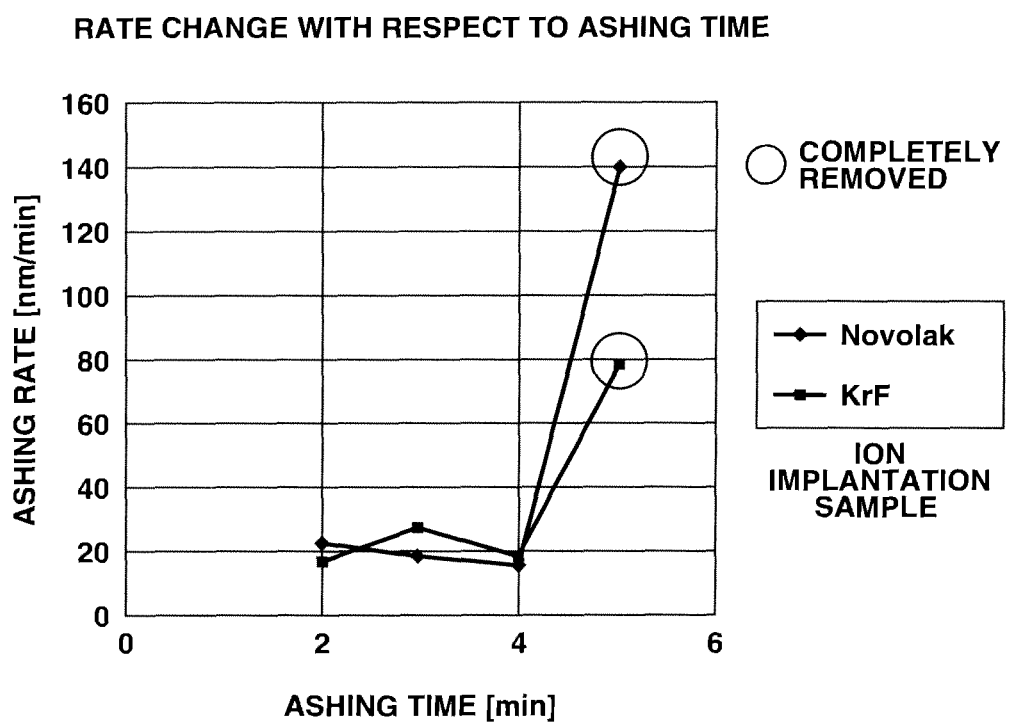
FIG. 12 shows change of each average resist removal rate when performing the process with a processing time being 2 minutes~5 minutes.

FIG. 12 shows change of each average resist removal rate when performing the process with a processing time being 2 minutes~5 minutes on the same condition as the above. As samples, two kinds of samples; anion-implanted g-line resist whose principal component is a novolac resin and an ion-implanted KrF resist were used (the ion implantation was performed on the same condition as the embodiment of FIG. 11). Although there is no large difference between the processing times 2 minutes~4 minutes, the resist removal rate of the processing time 5 minutes is abruptly high. The reason why this rate change occurred is that it is conceivable that the surface hardened layer is removed during a period of 2~4 minutes and an unaffected layer of the lower layer which is not hardened is removed during a period of 4~5 minutes. In the case of 5 minutes, resists of both samples are completely removed. A difference of the removal rate at this time is due to a difference of the original thickness between them. When checking the surface after performing the process for each processing time, it was found that the surface discolored with time (after 2 minute, 3 minute, 4 minute, 5 minute) and a resist coating thickness changed.

Figure 3:
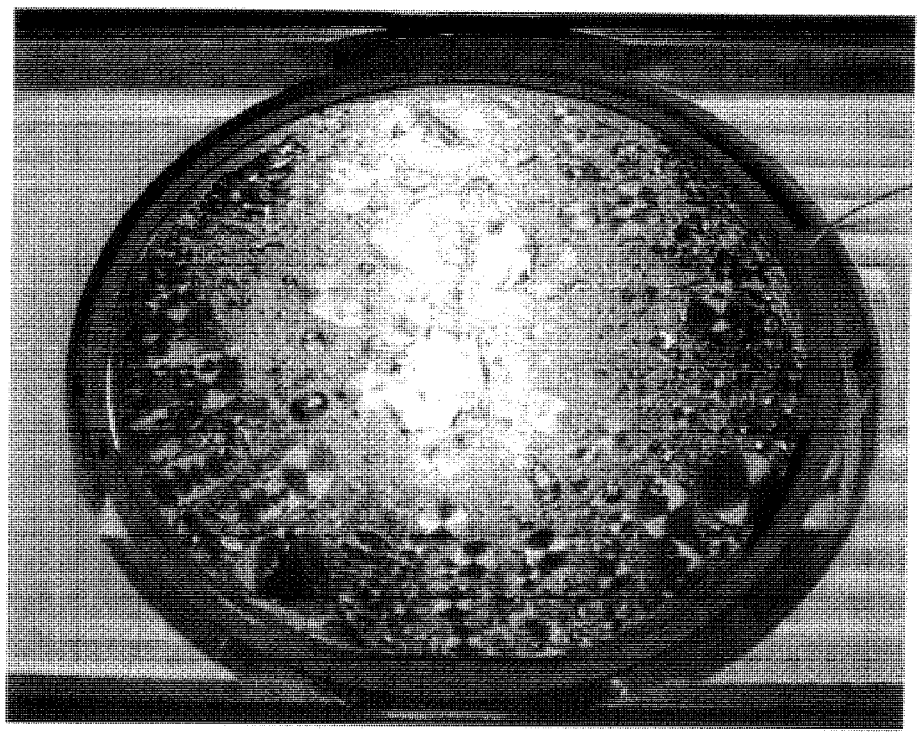
FIG. 3 is a photograph of appearance of a Si substrate surface which is treated by a resist removal method of a comparative example (only 8% ozone gas).
Figure 4:
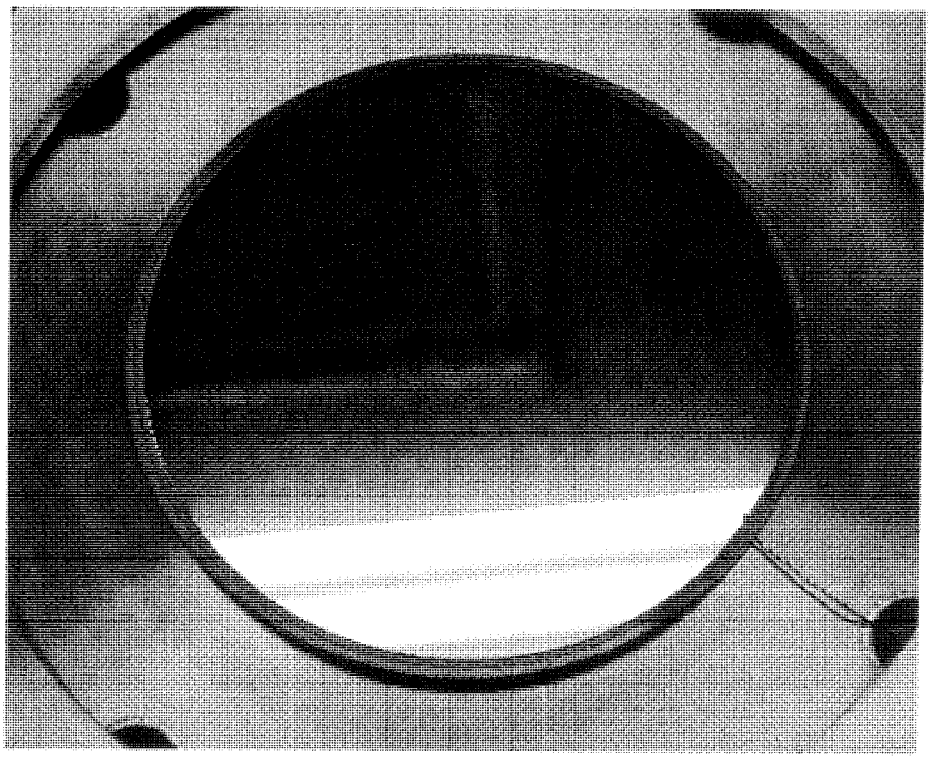
FIG. 4 is a photograph of appearance of a Si substrate surface which is treated by a resist removal method of a comparative example (only 100% ozone gas).

On the other hand, FIG. 4 is a photograph of appearance of a substrate surface which is treated by a resist removal method of a comparative example. More specifically, it is a photograph of appearance of a Si substrate coated with KrF resist into which P (phosphorus) of 5E15/cm$^2$ (5×10$^{15}$/cm$^2$) is implanted, which is treated with only the ultra-high concentration ozone gas supplied and with the temperature of the susceptor 15 being 400° C. It was found that, although the resist was able to be removed using this method, because of high temperature, the popping occurred, and the resist surface hardened layer, which was going to be filmy fine particles, was adhered to the inside of the chamber. Further, it was found that, in a case of the process with only ozone gas of ozone concentration 8 vol % with the temperature of the susceptor 15 being 400° C., the popping phenomenon occurred (FIG. 3).

Figure 5:
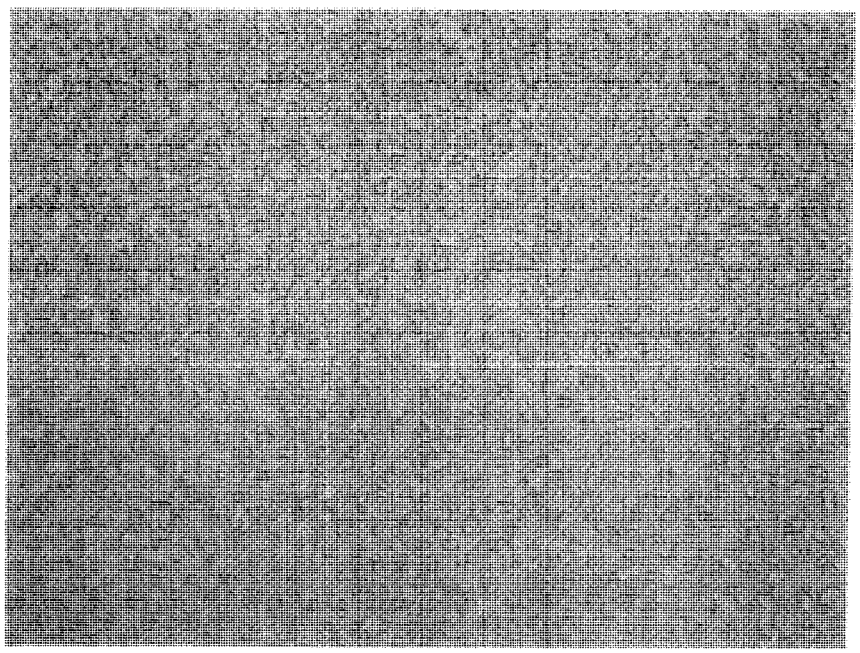
FIG. 5 is an enlarged photograph (magnification 400 times) of a surface of a resist boundary part of a substrate which is treated by a resist removal method according to the embodiment of the present invention.

FIG. 5 is an enlarged photograph (magnification 400 times) of a surface of a resist boundary part of the substrate which is treated by the resist removal method according to the embodiment. It can be found that there is no filmy exfoliation and also there is no popping that causes the particles.

Figure 6:
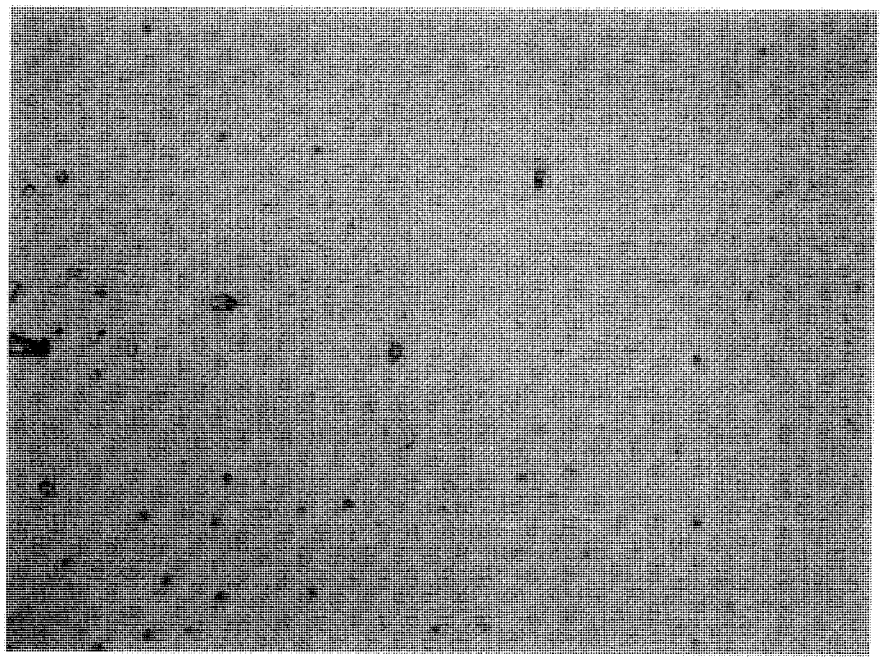
FIG. 6 is an enlarged photograph (magnification 400 times) of a surface of a center area of the substrate which is treated by the resist removal method according to the embodiment of the present invention.

FIG. 6 is an enlarged photograph (magnification 400 times) of a surface of a center area of the substrate which is treated by the resist removal method according to the embodiment. It can be found that, although residues appear on the surface of the center area, it is remarkably less than the surface of the resist boundary part of FIG. 5. These residues tend to increase with time after being taken out from the chamber, and by cleaning with ultrapure water, these residues can be removed. Therefore it is conceivable that the residue is not a resist residue, but oxide (in this case, P$_2$O$_5$ or P$_2$O$_3$) of ion that is implanted into the resist. With regard to the implantation ion used in the semiconductor manufacturing process, it is conceivable that, since the implantation ion often forms a low vapor pressure water soluble compound by oxidation, it remains on the substrate even after the process, and after being taken out from the chamber, it absorbs moisture in the air, then was observed as a surface residue.

The invention claimed is:

1. A method for removing a resist comprising:
   supplying unsaturated hydrocarbon gas or fluorine substitution product gas of unsaturated hydrocarbon, at a lower pressure than an atmospheric pressure, to a system of reaction capable of heating a substrate;
   supplying ozone gas, at a lower pressure than the atmospheric pressure, to the system of reaction; and
   removing a resist on the substrate.

2. The method for removing the resist as claimed in claim 1, wherein:
   the ozone gas is ultra-high concentration ozone gas that is obtained by separating only ozone from ozone-containing gas by a difference of vapor pressure through liquefaction separation and by vaporizing a liquefaction-separated ozone again.

3. The method for removing the resist as claimed in claim 1, wherein:
   the substrate is held on a susceptor and heated.

4. The method for removing the resist as claimed in claim 1, wherein:
   the removing step comprises removing an ion-implanted resist.

5. The method for removing the resist as claimed in claim 1, wherein:
   when removing the resist on the substrate, an internal pressure of the system of reaction is controlled so that a temperature of the substrate is 90° C. or less.

6. The method for removing the resist as claimed in claim 3, wherein:
   the substrate is heated through radiation of infrared light to the susceptor.

7. The method for removing the resist as claimed in claim 4, further comprising:
   cleaning the substrate with pure water after supplying the ozone gas and the unsaturated hydrocarbon gas.

* * * * *